United States Patent
Chen et al.

(10) Patent No.: US 11,422,630 B2
(45) Date of Patent: Aug. 23, 2022

(54) DISPLAY PANEL AND ELECTRONIC DEVICE

(71) Applicant: BEIJING XIAOMI MOBILE SOFTWARE CO., LTD., Beijing (CN)

(72) Inventors: Jing Chen, Beijing (CN); Chiafu Yen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/244,875

(22) Filed: Apr. 29, 2021

(65) Prior Publication Data
US 2022/0057863 A1 Feb. 24, 2022

(30) Foreign Application Priority Data

Aug. 21, 2020 (CN) .......................... 202010851841.9

(51) Int. Cl.
*G06F 3/01* (2006.01)
*H05K 7/20* (2006.01)

(52) U.S. Cl.
CPC .......... *G06F 3/016* (2013.01); *H05K 7/20963* (2013.01)

(58) Field of Classification Search
None
See application file for complete search history.

(56) References Cited

U.S. PATENT DOCUMENTS

| | | |
|---|---|---|
| 2018/0143689 A1* | 5/2018 | Heubel ............... G06F 3/04886 |
| 2019/0205595 A1 | 7/2019 | Gong et al. |
| 2019/0250752 A1 | 8/2019 | Shim et al. |
| 2019/0265795 A1 | 8/2019 | Ishii et al. |

FOREIGN PATENT DOCUMENTS

KR 20200083118 A 7/2020

OTHER PUBLICATIONS

European Search Report in European Application No. 21170765.8, dated Oct. 6, 2021, (8p).

* cited by examiner

*Primary Examiner* — Carl Adams
(74) *Attorney, Agent, or Firm* — Arch & Lake LLP

(57) ABSTRACT

A display panel and an electronic device are provided. The display panel may include a display layer, a protective layer and a support layer. The display layer may be arranged between the protective layer and the support layer. The support layer may be coupled to the display layer and may include a piezoelectric film layer. The piezoelectric film layer may drive the display layer and the protective layer to vibrate in response to determining that the piezoelectric film layer is deformed.

18 Claims, 7 Drawing Sheets

DISPLAY PANEL AND ELECTRONIC DEVICE

CROSS-REFERENCE TO RELATED APPLICATION

This application is based upon and claims priority to Chinese Patent Application No. 202010851841.9, filed Aug. 21, 2020, the entire content of which is incorporated herein by reference for all purposes.

TECHNICAL FIELD

The present disclosure relates to the technical field of a terminal, and particularly to a display panel and an electronic device.

BACKGROUND

Currently, in order to buffer the impact force from the back side, a display panel of an electronic device is usually provided with buffer foam on the back side of the display panel away from the display side, so that the impact force is buffered by the buffer foam. However, the strength of the buffer foam is weak, and a relatively large deformation may occur when the buffer foam is subjected to a relatively small impact force, so that pits or defective pixel may appear on the screen, thereby affecting the display effect.

SUMMARY

The present disclosure provides a display panel and an electronic device, so as to address deficiencies in the related art.

According to a first aspect of the present disclosure, there is provided a display panel. The display panel may include a display layer, a protective layer and a support layer. The display layer may be arranged between the protective layer and the support layer. The support layer may be connected to the display layer and may include a piezoelectric film layer. The piezoelectric film layer drives the display layer and the protective layer to vibrate in response to determining that the piezoelectric film layer is deformed.

According to a second aspect of the present disclosure, there is provided an electronic device. The electronic device may include a display panel. The display panel may include a display layer, a protective layer, and a support layer. The display layer may be arranged between the protective layer and the support layer. The support layer may be coupled to the display layer and may include a piezoelectric film layer. The piezoelectric film layer may drive the display layer and the protective layer to vibrate in response to determining that the piezoelectric film layer is deformed.

It will be understood that the above general description and the following detailed description are merely examples and explanatory, and are not intended to limit the present disclosure.

BRIEF DESCRIPTION OF THE DRAWINGS

The accompanying drawings here, which are incorporated into the description and constitute a part of the description, illustrate embodiments consistent with the present disclosure and together with the description, serve to explain the principles of the disclosure.

DETAILED DESCRIPTION

Reference will now be made in detail to embodiments, examples of which are illustrated in the accompanying drawings. The following description refers to the accompanying drawings in which the same numbers in different drawings represent the same or similar elements unless otherwise represented. The implementations set forth in the following description of embodiments do not represent all implementations consistent with the present disclosure. Instead, they are merely examples of apparatuses and methods consistent with aspects related to the present disclosure as recited in the appended claims.

Terms used in the present disclosure are only adopted for the purpose of describing specific embodiments and not intended to limit the present disclosure. "A/an", "said" and "the" in a singular form in the present disclosure and the appended claims are also intended to include a plural form, unless other meanings are clearly denoted throughout the present disclosure. It is also to be understood that expression "and/or" used in the present disclosure refers to and includes any or all possible combinations of one or more associated items that are listed.

It will be understood that although terms "first", "second", "third", and the like are used in the present disclosure to describe various information, the information is not limited to the terms. These terms are merely used to differentiate information of a same type. For example, without departing from the scope of the present disclosure, first information may also be called second information, and similarly second information may also be called first information. Depending on the context, for example, the wording "if" used herein may be explained as "when" or "while", or "in response to a determination".

Figure 1:
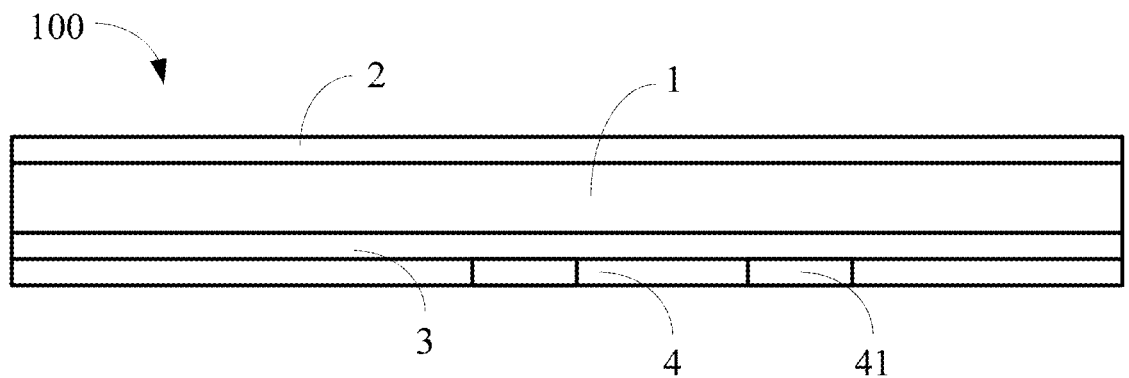
FIG. 1 is a cross-sectional schematic diagram of a display, according to an example of the present disclosure.

FIG. 1 is a cross-sectional schematic diagram of a display panel shown in an embodiment. As shown in FIG. 1, the present disclosure provides a display panel 100. The display panel 100 may include a display layer 1, a protective layer 2 and a support layer 3. The display layer 1 is arranged between the protective layer 2 and the support layer 3. The protective layer 2 may be arranged closer to the outside of the display panel 100 with respect to the display layer 1, and may include a cover glass or a film layer. The cover glass resists an impact force from the front side of the display panel 100 while protecting the display panel 100 from dust. The support layer 3 may be connected to the display layer 1, and may include a piezoelectric film layer. When the piezoelectric film layer is powered on, it may be deformed to drive the display layer 1 and the protective layer 2 to vibrate, to allow the display panel 100 to produce a sound through vibration. Meanwhile, when the user touches or presses the display panel 100, the piezoelectric film layer may be powered on to drive the display layer 1 and the protective layer 2 to vibrate, thereby providing tactile feedback on the touch or pressing operation performed by the user. The display panel 100 may include an organic light-emitting display panel or a liquid crystal display panel, which is not limited in the present disclosure.

Further, as still shown in FIG. 1, the display panel 100 may further include an electrostatic protective layer 4. The electrostatic protective layer 4 may be connected to the support layer 3 and the support layer 3 is arranged between the display layer 1 and the electrostatic protective layer 4, so that the purpose of electrostatic protection can be achieved by the electrostatic protective layer 4 during power supply of the piezoelectric film layer. The electrostatic protective layer 4 may include a copper foil layer. Further, as still shown in FIG. 1, the electrostatic protective layer 4 may include an air vent 41. The heat dissipation of the piezoelectric film layer, the display layer and the like can be performed through the electrostatic protective layer 4.

As can be seen from the above embodiments, in the display panel 100 of the present disclosure, the display layer 1 can be supported by the connection between the support layer 3 and the display layer 1, which facilitates improving the overall impact resistance of the display panel 100. Since the support layer 3 may include a piezoelectric film layer, the vibration of the display panel 100 can be realized by the piezoelectric film layer, thereby achieving the purposes of producing sound through vibration as well as tactile feedback.

Figure 2:
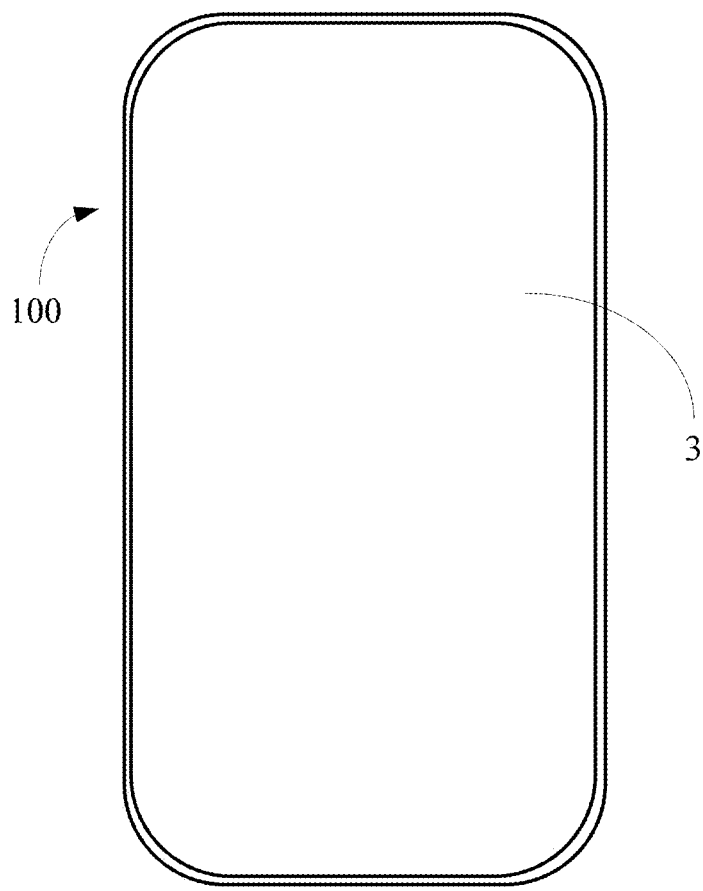
FIG. 2 is a top view illustrating a display panel, according to an example of the present disclosure.
Figure 3:
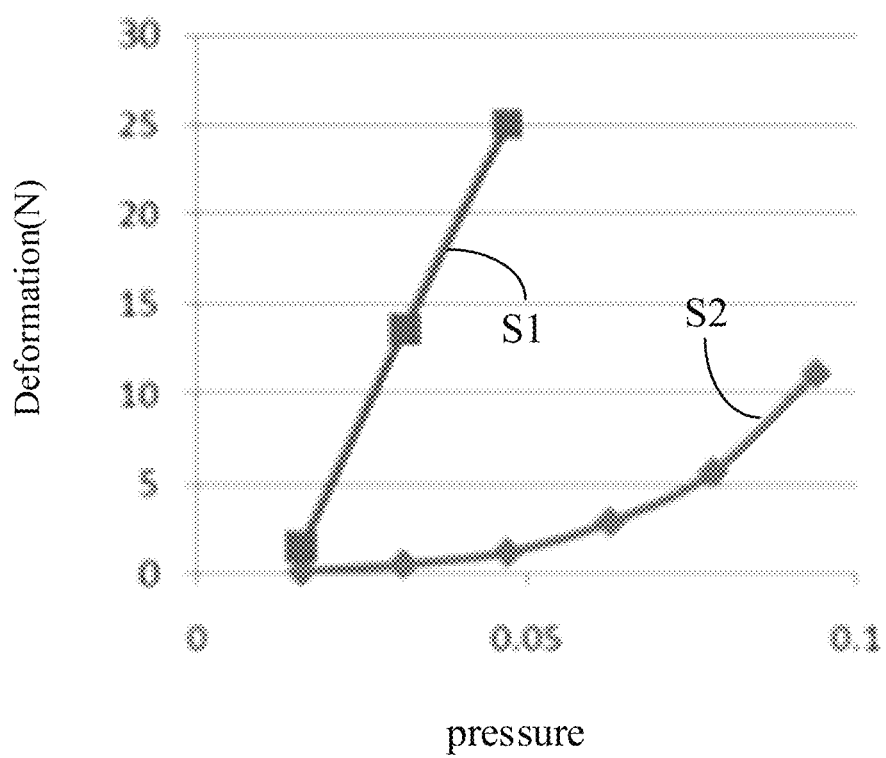
FIG. 3 is a graph illustrating a relationship between a pressure-deformation curve of buffer foam and a pressure-deformation curve of a piezoelectric film layer, according to an example of the present disclosure.

Currently, in order to buffer the impact force from the back side, a display panel of an electronic device is usually provided with buffer foam on the back side of the display panel away from the display side. However, the buffer foam has a relatively weak impact resistance and is easily deformed when subjected to an external impact, thereby causing the display panel to deform therewith. Generally, in the case where the impact force from the back side is greater than 10N, the impact force is applied to the display layer of the display panel through the buffer foam, which may easily cause pits to appear on the front side of the display panel. In the case where the impact force from the back side is greater than 300N, the impact force is applied to the display layer of the display panel through the buffer foam, which may easily cause defective pixels to appear on the display panel, resulting in a poor display effect. Therefore, in one embodiment, as shown in FIGS. 1 and 2, the support layer 3 may include only a piezoelectric film layer. That is, the piezoelectric film layer may be directly or indirectly connected to the display layer 2. As can be seen from pressure-deformation curve of each of buffer foam and a piezoelectric film layer in FIG. 3, the piezoelectric film layer has a higher hardness, and the deformation of the piezoelectric film layer is less than that of the buffer foam under the same pressure. Therefore, compared to the technical description in the related art in which the buffer foam is used for supporting, the display layer 1 can be supported by the piezoelectric film layer in the present disclosure, which can realize the functions of sound production through vibration as well as tactile feedback of the display panel 100, while improving the impact resistance of the display panel 100 and reducing the damage risk of the display panel 100 under the external impact force, and which can also facilitate increasing the area of the piezoelectric film layer, thereby increasing the area of a region of the display panel 100 where tactile feedback can be performed.

Figure 4:
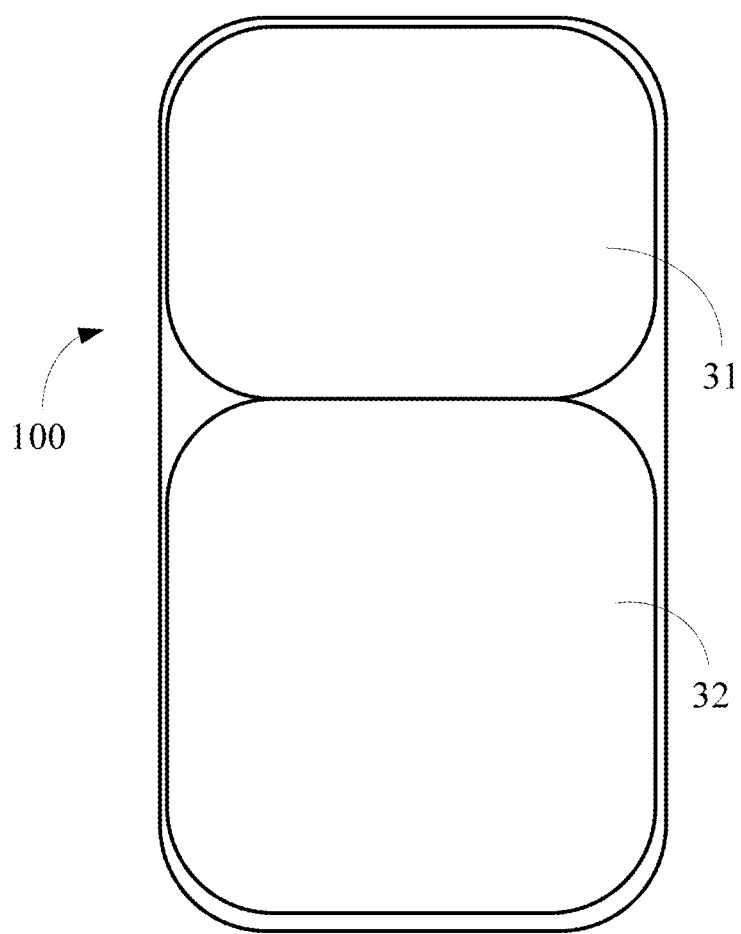
FIG. 4 is a top view illustrating another display panel, according to an example of the present disclosure.
Figure 5:
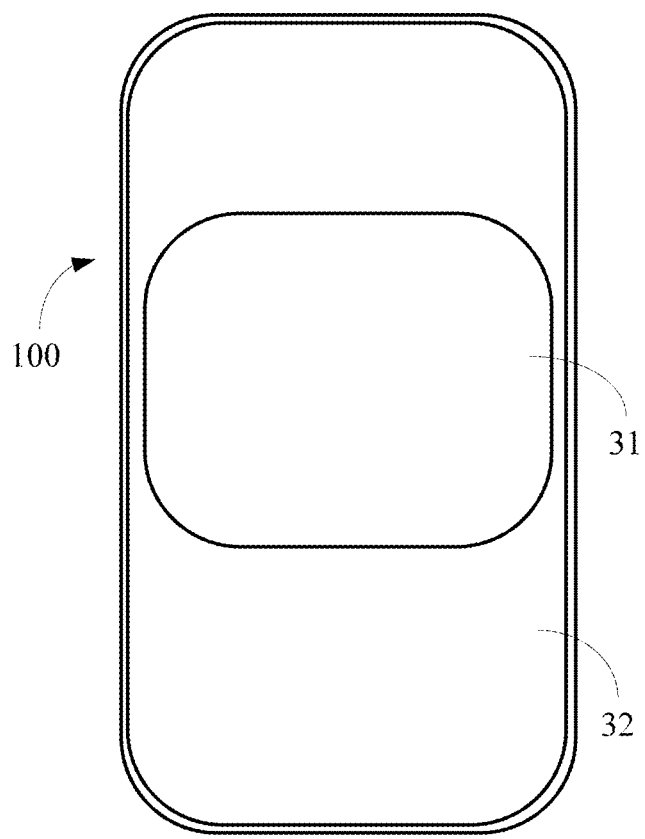
FIG. 5 is atop view illustrating a yet another display panel, according to an example of the present disclosure.

In another embodiment, as shown in FIGS. 4 and 5, the support layer 3 may include a piezoelectric film layer 31 and a buffer layer 32. At least one of the buffer layer 32 and the piezoelectric film layer 31 may be connected to the display layer 1. The buffer layer 32 may include foam. The buffer layer 32 and the piezoelectric film layer 31 may jointly implement the support action, which can save the material usage of the piezoelectric film layer 31 thereby reducing the cost, while realizing the functions of sound production through vibration and tactile feedback of the display panel 100. Herein, the buffer layer 32 and the piezoelectric film layer 31 may be arranged adjacent to each other as shown in FIG. 4; or the buffer layer 32 may be arranged around the piezoelectric film layer 31 as shown in FIG. 5. Alternatively, in other embodiments, the piezoelectric film layer 31 may also be arranged around the buffer layer 32; or the buffer layer 32 may also be arranged around a portion of the piezoelectric film layer 31; or the piezoelectric film layer 31 may be arranged around a portion of the buffer layer 32, which is not limited in the present disclosure.

Figure 6:
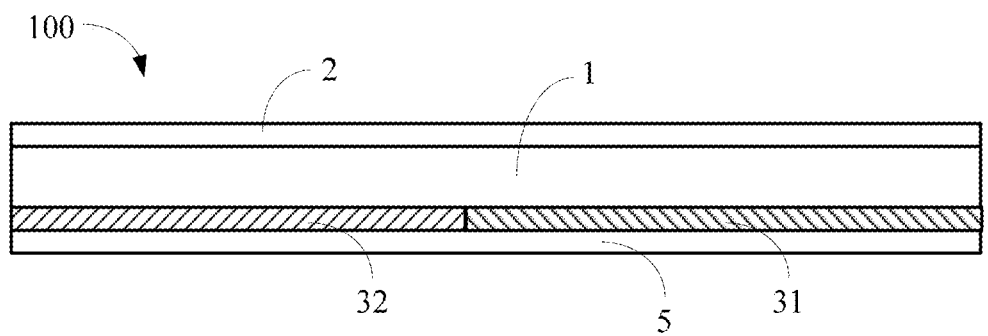
FIG. 6 is a first cross-sectional schematic diagram of a display panel illustrated in an example of the present disclosure.
Figure 7:
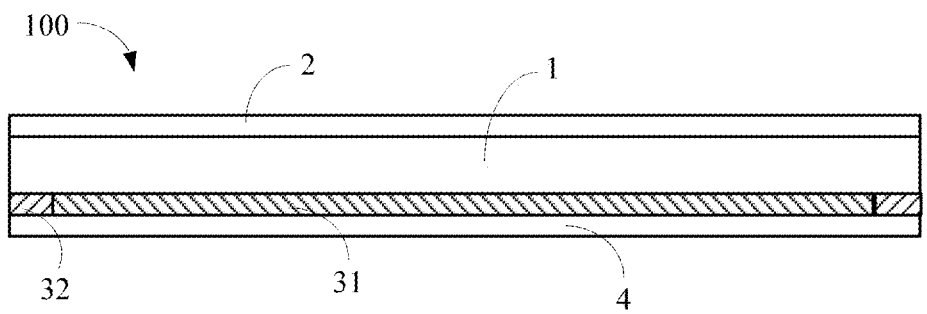
FIG. 7 is a second cross-sectional schematic diagram of a display panel illustrated in an example of the present disclosure.

In one embodiment, as shown in FIGS. 6 and 7, the piezoelectric film layer 31 and the buffer layer 32 of the support layer 3 are both connected to the display layer 1. That is, the buffer layer 32 and the piezoelectric film layer 31 may be arranged side by side. Moreover, the thickness of the buffer layer 32 may be substantially the same as the thickness of the piezoelectric film layer 31. Thus, each of the buffer layer 32 and the piezoelectric film layer 31 may be connected to the display layer 1 and the electrostatic protective layer 4. Compared to the technical description in FIG. 6, in the technical description in FIG. 7, the piezoelectric film layer 31 has a larger area, so that the area of the tactile feedback region on the display panel 100 is larger, and the sound pressure level is higher when the sound is produced in the display panel 100.

Figure 8:
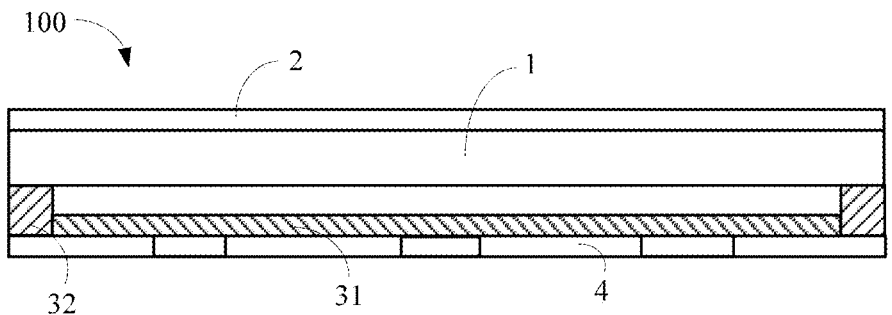
FIG. 8 is a third cross-sectional schematic diagram of a display panel, according to an example of the present disclosure.

In another embodiment, as shown in FIG. 8, the buffer layer 32 may be arranged around the piezoelectric film layer 31. Moreover, the buffer layer 32 is connected to the display layer 1 and the electrostatic protective layer 4, while the piezoelectric film layer 31 is connected to the electrostatic protective layer 4 and may be spaced from the display layer 1 by a predetermined distance. When the piezoelectric film layer 31 vibrates, vibration may be transmitted to the electrostatic protective layer 4 and the buffer layer 32, and then to the display layer 1 and the protective layer 2 through the buffer layer 32. Since the composite structure of the electrostatic protective layer 4 for driving the display layer 1 and the protective layer 2 is relatively light, the pushing force that urges the electrostatic protective layer 4 to vibrate is smaller than the pushing force for pushing the display layer 1 and the protective layer 2. Further, in the case that the piezoelectric film layer 31 is connected to each of positions of a region of the electrostatic protective layer 4 surrounded by the buffer layer 32, a sound chamber may be formed by the piezoelectric film layer 31, the buffer layer 32 and the display layer 1 surrounding the sound chamber, so as to improve the sound production effect of the display panel 100. Alternatively, in other embodiments, in the case that a part of positions of the region of the electrostatic protective layer 4 surrounded by the buffer layer 32 is not attached with the piezoelectric film layer 31, the sound chamber may also be formed by the piezoelectric film layer 31, the buffer layer 32, the display layer 1 and the electrostatic protective layer 4 surrounding the sound chamber.

Figure 9:
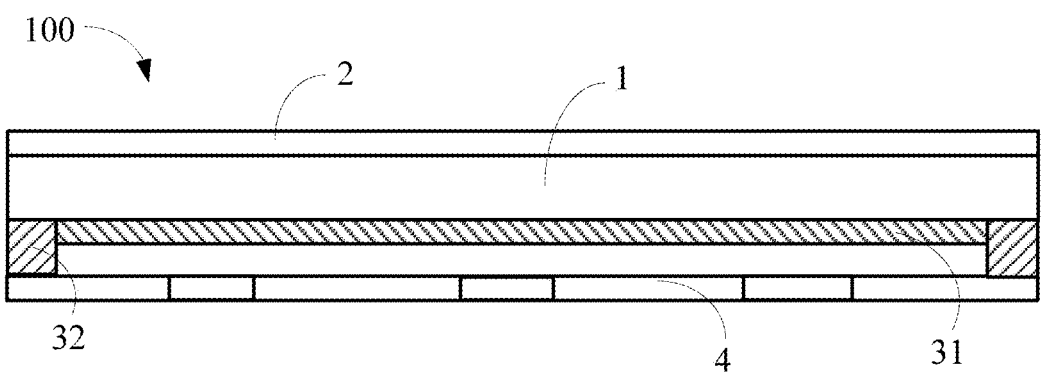
FIG. 9 is a fourth cross-sectional schematic diagram of a display panel illustrated in an example of the present disclosure.

In a yet another embodiment, as shown in FIG. 9, the buffer layer 32 may be arranged around the piezoelectric film layer 31. Also, the buffer layer 32 is connected to the display layer 1 and the electrostatic protective layer 4, while the piezoelectric film layer 31 is connected to the display layer 1 and may be spaced from the electrostatic protective layer 4 by a predetermined distance. In this way, when the piezoelectric film layer 31 vibrates, since the piezoelectric film layer 31 is directly connected to the display layer 1, vibration can be directly transmitted to the display layer 1, so that the vibration transmission process can be shortened and loss can be reduced, compared to the technical description of FIG. 8. Further, in the case that the piezoelectric film layer 31 is connected to each of positions of a region of the display layer 1 surrounded by the buffer layer 32, a sound chamber may be formed by the piezoelectric film layer 31, the buffer layer 32 and the electrostatic protective layer 4 surrounding sound chamber, so as to improve the sound production effect of the display panel 100. Alternatively, in other embodiments, in the case that a part of positions of the region of the display layer 1 surrounded by the buffer layer 32 is not attached with the piezoelectric film layer 31, the sound chamber may also be formed by the piezoelectric film layer 31, the buffer layer 32, the display layer 1 and the electrostatic protective layer 4 surrounding the sound chamber.

In each of the above embodiments, a first heat dissipating layer (not shown) may also be provided within the display panel 100. The first heat dissipating layer may be arranged between the support layer 3 and the electrostatic protective layer 4. In particular, the first heat dissipating layer may be arranged between the buffer layer 32 and the electrostatic protective layer 4, or may be arranged between the piezoelectric film layer 31 and the electrostatic protective layer 4. Alternatively, a first heat dissipating layer may be provided between the buffer layer 32 and the electrostatic protective layer 4 and between the piezoelectric film layer 31 and the electrostatic protective layer 4, which is not limited in the present disclosure.

Similarly, a second heat dissipating layer (not shown) may be provided between the support layer 3 and the display layer 1. The second heat dissipating layer may be arranged between the buffer layer 32 and the display layer 1, or may also be arranged between the piezoelectric film layer 31 and the display layer 1. Alternatively, a second heat dissipating layer may be provided between the buffer layer 32 and the display layer 1 and between the piezoelectric film layer 31 and the display layer 1. The second heat dissipating layer may be designed as desired, which is not limited in the present disclosure. Herein, each of the first heat dissipating layer and the second heat dissipating layer may include a graphite layer.

Figure 10:
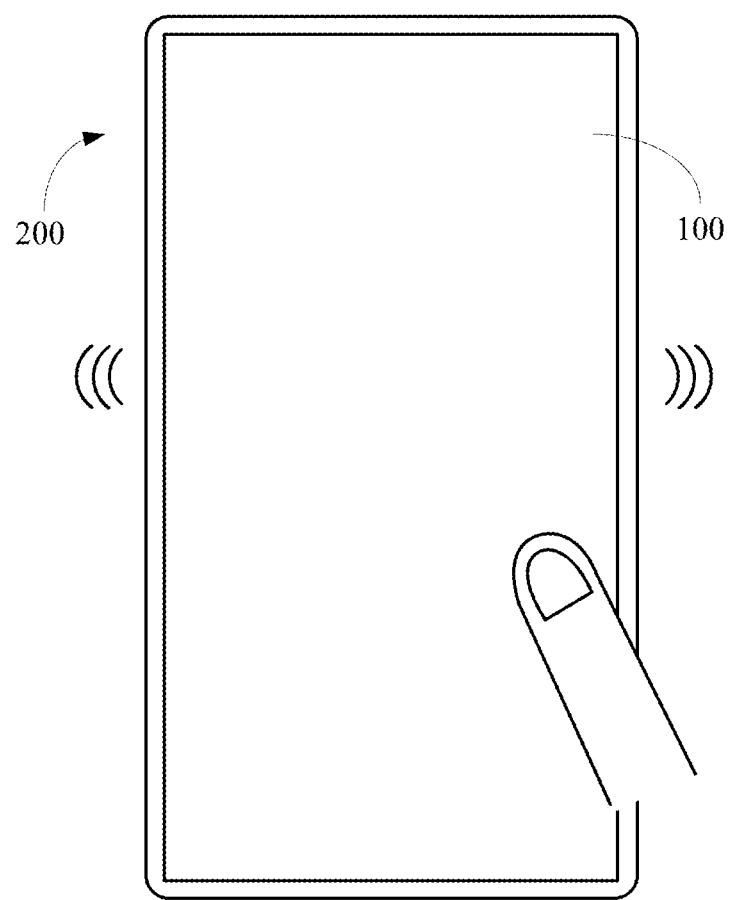
FIG. 10 is a structural schematic diagram illustrating an electronic device, according to an example of the present disclosure.

Based on the display panel 100 described in each of the above embodiments, the present disclosure also provides an electronic device 200 as shown in FIG. 10. The electronic device 200 may be provided with the display panel 100 described in any of the above embodiments. The functions of sound production and tactile feedback of the electronic device 200 can be realized through the display panel 100.

The electronic device 200 may include devices such as a mobile phone terminal, a tablet terminal, an intelligent home device, etc.

Other implementations of the present disclosure will be apparent to those skilled in the art from consideration of the specification and practice of the present disclosure. This disclosure is intended to cover any variations, uses, or adaptations of the present disclosure following the general principles thereof and including such departures from the present disclosure as come within known or customary technical means in the art. It is intended that the specification and examples be considered as examples only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A display panel, comprising:
    a display layer,
    a protective layer;
    a support layer connected to the display layer and, wherein the display layer is arranged between the protective layer and the support layer, and wherein the support layer comprises a piezoelectric film layer, wherein the piezoelectric film layer drives the display layer and the protective layer to vibrate in response to determining that the piezoelectric film layer is deformed, and
    an electrostatic protective layer coupled to the support layer, wherein the support layer is arranged between the electrostatic protective layer and the display layer.

2. The display panel of claim 1, wherein the support layer comprises only the piezoelectric film layer coupled to a side of the display layer away from the protective layer.

3. The display panel of claim 1, wherein the support layer comprises a buffer layer, and wherein at least one of the buffer layer and the piezoelectric film layer are coupled to a side of the display layer away from the protective layer.

4. The display panel of claim 3, wherein the buffer layer is arranged adjacent to the piezoelectric film layer, the buffer layer is arranged around at least a portion of the piezoelectric film layer, or the piezoelectric film layer is arranged around at least a portion of the buffer layer.

5. The display panel of claim 1, wherein the support layer further comprises a buffer layer, and wherein each of the buffer layer and the piezoelectric film layer are coupled to the electrostatic protective layer and the display layer.

6. The display panel of claim 1, wherein the support layer comprises a buffer layer arranged around the piezoelectric film layer, wherein the buffer layer is coupled to the display layer and the electrostatic protective layer, and wherein the piezoelectric film layer is coupled to the display layer and spaced from the electrostatic protective layer by a predetermined distance; and
    wherein a sound chamber is formed either by the piezoelectric film layer, the electrostatic protective layer, and the buffer layer surrounding the sound chamber, or by the piezoelectric film layer, the electrostatic protective layer, the display layer, and the buffer layer surrounding the sound chamber.

7. The display panel of claim 1, wherein the support layer comprises a buffer layer arranged around the piezoelectric film layer, wherein the buffer layer is coupled to the display layer and the electrostatic protective layer, wherein the piezoelectric film layer is coupled to the electrostatic protective layer and spaced from the display layer by a predetermined distance; and wherein a sound chamber is formed either by the piezoelectric film layer, the display layer, and the buffer layer surrounding the sound chamber, or by the piezoelectric film layer, the electrostatic protective layer, the display layer, and the buffer layer surrounding the sound chamber.

8. The display panel of claim 1, wherein the electrostatic protective layer comprises an air vent.

9. The display panel of claim 1, further comprising:
a first heat dissipating layer arranged between the support layer and the electrostatic protective layer.

10. The display panel of claim 9, further comprising:
a second heat dissipating layer arranged between the support layer and the display layer.

11. An electronic device, comprising:
a display panel, wherein the display panel comprises:
a display layer,
a protective layer,
a support layer, wherein the display layer is arranged between the protective layer and the support layer, and the support layer is coupled to the display layer and comprises a piezoelectric film layer, wherein the piezoelectric film layer drives the display layer and the protective layer to vibrate in response to determining that the piezoelectric film layer is deformed, and
an electrostatic protective layer coupled to the support layer, and wherein the support layer is arranged between the electrostatic protective layer and the display layer.

12. The electronic device of claim 11, wherein the support layer comprises only the piezoelectric film layer coupled to a side of the display layer away from the protective layer.

13. The electronic device of claim 11, wherein the support layer comprises a buffer layer, and wherein at least one of the buffer layer and the piezoelectric film layer are coupled to a side of the display layer away from the protective layer.

14. The electronic device of claim 13, wherein the buffer layer is arranged adjacent to the piezoelectric film layer, the buffer layer is arranged around at least a portion of the piezoelectric film layer, or the piezoelectric film layer is arranged around at least a portion of the buffer layer.

15. The electronic device of claim 11, wherein the support layer further comprises a buffer layer, and wherein each of the buffer layer and the piezoelectric film layer are coupled to the electrostatic protective layer and the display layer.

16. The electronic device of claim 11, wherein the support layer comprises a buffer layer arranged around the piezoelectric film layer, wherein the buffer layer is coupled to the display layer and the electrostatic protective layer, and wherein the piezoelectric film layer is coupled to the display layer and spaced from the electrostatic protective layer by a predetermined distance; and wherein a sound chamber is formed either by the piezoelectric film layer, the electrostatic protective layer and the buffer layer surrounding the sound chamber, or by the piezoelectric film layer, the electrostatic protective layer, the display layer, and the buffer layer surrounding the sound chamber.

17. The electronic device of claim 11, wherein the support layer further comprises a buffer layer arranged around the piezoelectric film layer, wherein the buffer layer is coupled to the display layer and the electrostatic protective layer, and wherein the piezoelectric film layer is coupled to the electrostatic protective layer and spaced from the display layer by a predetermined distance; and wherein a sound chamber is formed either by the piezoelectric film layer, the display layer, and the buffer layer surrounding the sound chamber, or by the piezoelectric film layer, the electrostatic protective layer, the display layer, and the buffer layer surrounding the sound chamber.

18. The electronic device of claim 11, wherein the electrostatic protective layer comprises an air vent.

* * * * *